United States Patent [19]
Matthews

[11] Patent Number: 5,691,554
[45] Date of Patent: Nov. 25, 1997

[54] PROTECTION CIRCUIT

[75] Inventor: Lloyd P. Matthews, Buda, Tex.

[73] Assignee: Motorola, Inc., Schaumburg, Ill.

[21] Appl. No.: 573,094

[22] Filed: Dec. 15, 1995

[51] Int. Cl.[6] .................................................. H01L 29/76
[52] U.S. Cl. ...................... 257/328; 257/106; 257/173; 257/356; 257/546; 257/551; 257/605
[58] Field of Search ................................. 257/106, 173, 257/328, 356, 546, 551, 605

[56] References Cited

U.S. PATENT DOCUMENTS 4,922,371  5/1990  Gray et al. ............................. 257/356

*Primary Examiner*—Edward Wojciechowicz

[57] ABSTRACT

A protection circuit (13) for an integrated circuit (10) is capable of handling higher externally-provided voltages supplied to internal circuitry within the integrated circuit (10). The protection circuit (13) comprises a zener diode (20), wherein a N+ type diffusion region (38) is separated from a P field implant (40) lying between the N+ type diffusion region (38) and a P+ type diffusion region (39).

16 Claims, 3 Drawing Sheets

PROTECTION CIRCUIT

FIELD OF THE INVENTION

The present invention relates in general to protection circuits for integrated circuits, and in particular, to an electrostatic discharge protection circuit for protecting internal circuitry within an integrated circuit.

BACKGROUND OF THE INVENTION

The internal circuitry within an integrated circuit (hereinafter referred to as "IC" or "chip") is susceptible to damage from voltages higher than for what the circuitry is rated. Particularly, internal circuitry within an IC is susceptible to damage from electrostatic discharge ("ESD"), originating from such sources as a mechanical chip carrier, a plastic chip storage device, or even a human being. For example, the typical human body can supply an electrostatic discharge of up to 4 kilovolts. For IC circuitry that operates at voltages of less than 6 volts, an electrostatic discharge of such proportions can be devastating.

In order to protect the internal circuitry, protection circuits are utilized, generally between the internal circuitry and the input/output ("I/O") pins of the chip. One common type of protection device utilized is a zener diode for clamping the voltage supplied to the internal circuitry to a predetermined voltage level.

It is often desired to externally supply a higher voltage to certain circuitry within a chip, which is well above the normal operating voltage (e.g., 5.5 volts) generally required by internal circuitry within a chip. Such high voltages may be used for testing of internal circuitry or for bulk programming or erasing of memory arrays, such as in a EEPROM memory array embedded within the chip. In such a situation, standard ESD structures are not adequate to protect this internal circuitry associated with the higher supply voltages.

Thus, there is a need in the art for a protection circuit that is capable of protecting internal circuitry within a chip, which requires a higher-than-normal supply voltage.

BRIEF DESCRIPTION OF THE DRAWING

For a more complete understanding of the present invention, and the advantages thereof, reference is now made to the following descriptions taken in conjunction with the accompanying drawings, in which.

DESCRIPTION OF A PREFERRED EMBODIMENT

Figure 1:
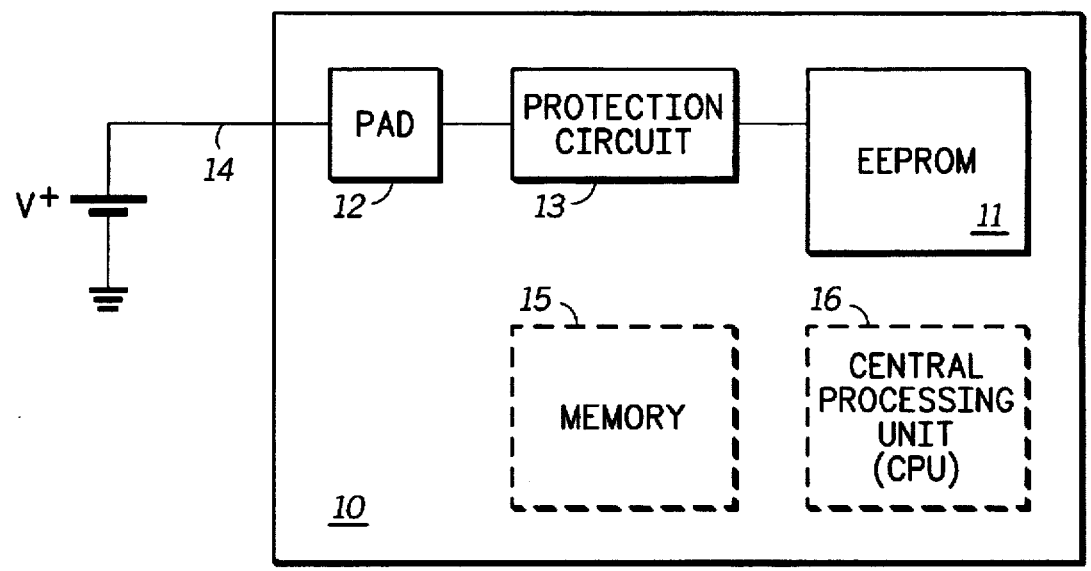
FIG. 1 illustrates a block diagram of an integrated circuit incorporating an embodiment of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated integrated circuit (IC) 10, which includes embedded EEPROM 11. EEPROM 11 requires a high-voltage source, designated as V in FIG. 1, (greater-than-normal operating voltages for CMOS structures), which must be supplied externally to chip 10. EEPROM 11 is shown for illustrative purposes only, and may be replaced for purposes of this discussion by any internal circuitry within an integrated circuit that requires a greater-than-normal supply voltage.

Integrated circuit 10 may include any other well-known circuitry typically found on an IC, such as a central processing unit ("CPU") 16 and a memory 15.

The greater-than-normal supply voltage V is provided to integrated circuit 10 by conductor 14 bonded to input/output ("I/O") pad 12, which may be any well-known I/O pad for providing external access to the internal circuitry of integrated circuit 10. Protection of the circuitry associated with EEPROM 11 is provided by protection circuit 13, which is further described below with respect to FIGS. 2–4. As discussed above, protection circuit 13 is designed to protect EEPROM 11 from high voltages inputted to pad 12, such as those caused by ESD.

Figure 2:
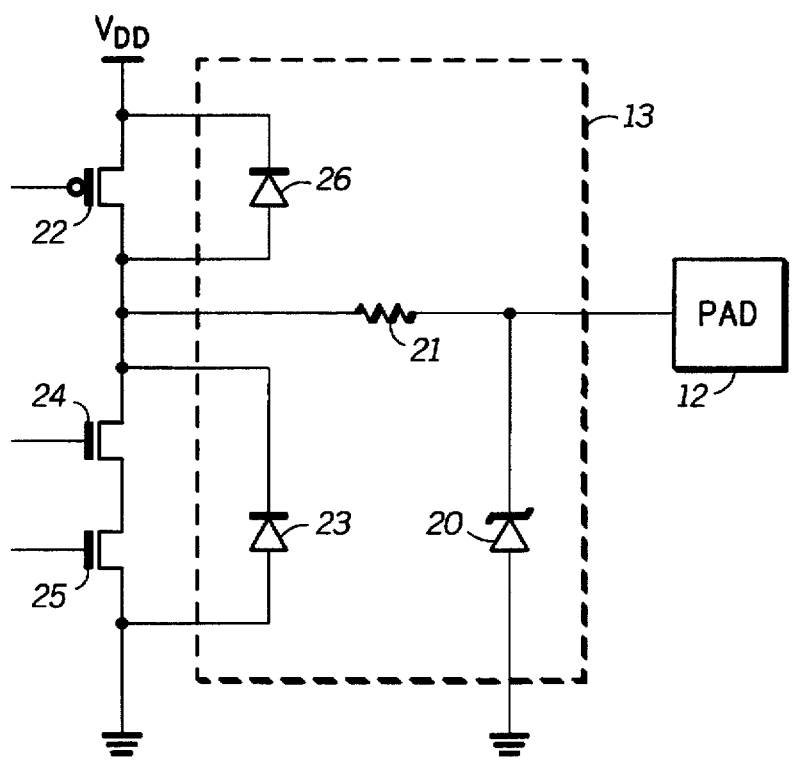
FIG. 2 illustrates a circuit diagram of an embodiment of the present invention.

Referring next to FIG. 2, there is frustrated a circuit diagram of protection circuit 13 coupled to pad 12. Since an ESD type event generally occurs when integrated circuit 10 is not coupled to any external circuitry, FIG. 2 illustrates pad 12 not coupled to conductor 14.

Protection circuit 13 includes zener diode 20, which is further described below with respect to FIGS. 3 and 4. Diode 20 is used to act as a clamping device (energy absorbing structure) in order to clamp, or limit, inputted voltages to a predetermined voltage determined by the breakdown voltage of diode 20.

Devices 22, 24, and 25 are part of the high-voltage switching circuitry in EEPROM 11. Their gate electrodes connect to other circuitry not shown for reasons of clarity of this description. Devices 22, 24 and 25 are part of the circuitry being protected by protection circuit 13.

In the illustrated embodiment, diodes 23 and 26 are parasitic diodes of devices 24 and 22, respectively, and are within the EEPROM 11 circuitry. However, these diodes could also be discrete diodes, which may be located at the site of pad 12.

Since devices 22–26 are configured and manufactured to have a breakdown voltage of X volts, where X represents a predetermined voltage. Diode 20 may be configured and manufactured to also have this same breakdown voltage. Ballast resistor 21 is then inserted therebetween to direct any current associated with an ESD type (or other high-voltage) event into diode 20 and not devices 22–26. However, any current-steering device (e.g., a diode) may be used instead of resistor 21.

Resistor 21 may be located adjacent to EEPROM 11 or may be located near pad 12 and zener diode 20. The physical locations of diodes 23 and 26 and resistor 21 on chip 10 are not important to the protection structure. However, it is desired that diode 20 be near pad 12.

Current-steering device 21 has a breakdown voltage higher than X.

In one embodiment of the present invention, X is a voltage that is higher than normal for chip circuitry for reasons such as those provided above. The protected devices are designed to have breakdown voltages as high as X volts in order to provide X volts to EEPROM 11. If diode 20 were to have a breakdown voltage less than X volts, then when X volts is provided to pad 12, diode 20 would break down and not allow the X volts to pass to EEPROM 11. If diode 20 were to have a breakdown voltage greater than X volts, then when a high-voltage event, such as an ESD type event, were to occur, then the protected devices within integrated circuit 10 would be damaged, since a voltage would be applied to them that is greater than their breakdown voltage, since diode 20 would not limit that voltage at the rated breakdown voltage of the protected devices, but instead at the higher breakdown voltage of diode 20. As a result, diode 20 is configured to have a breakdown voltage substantially the same as the breakdown voltage of the protected devices. This allows X volts to pass through to EEPROM 11, but also provides that diode 20 will not pass a very high voltage, such as one occurring due to an ESD type event, to the protected devices, since ballast resistor 21 will force the current associated with such a very high voltage through diode 20.

Figure 4:
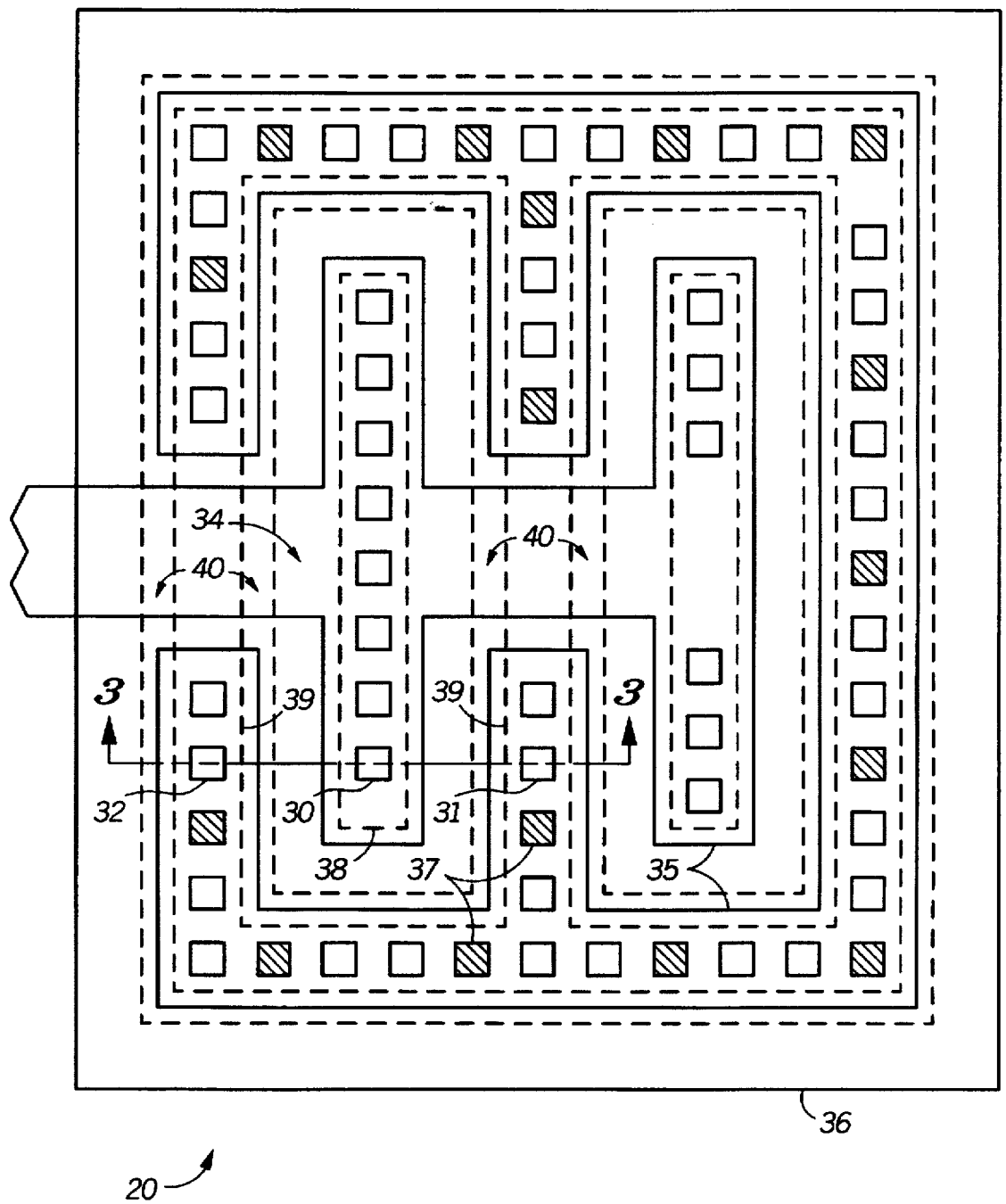
FIG. 4 illustrates a top level diagram of the semiconductor diode shown in FIG. 3.

Referring next to FIG. 4, there is illustrated a top level view of diode 20, which is a semiconductor diode. Note that in this view some layers of the semiconductor diode 20 are shown uncovered and some are not; this view is intended to show the basic outlay of the structure and not the structure of diode 20 at any one particular layer. In the illustrated embodiment, diode 20 is constructed on a P− substrate 34, or in a P well.

A first metal layer 35 is tied to pad 12 (VDD), while a second metal layer 36 is coupled to the ground plane of integrated circuit 10 (VSS). The second metal layer 36 is connected to the first metal layer 35 through vias, such as vias 37. The vias are placed in number and location around the guard ring to allow uniform current flow from the N+ type region 38 to the P+ type region 39. If the vias are not uniformly distributed, and are too few in number, the current flow from the two regions will not be uniform and will crowd to one or more locations, causing high current densities in the N+/P− junction, causing premature failure. The same holds for the number and distribution of contacts to the P+ and N+ type regions.

The P+ type region 39 forms a P+ guard ring that surrounds the N+ anode, which is the N+ type region 38. The P+ type region 39 forms the cathode connection for zener diode 20. The series resistance of zener diode 20 directly impacts the diode current versus voltage characteristics. This resistance is composed of the resistance of the P+ type region 39 in series with the resistance of the P− substrate 34, or P well, between the P+ and N+ type regions. With the pull-back of the P field, the P− substrate is more resistive, so it is of particular importance to have the P+ region surround the N+ region and to have the P+ type region 39 as close as possible (within the manufacturing constraints of the process) to the N+ type region 38, thus reducing the resistance. Note that the corners of the N+ type region 38 may be chamfered (not shown) to reduce the electric field at the corners, thus raising the breakdown voltage at the corners of the N+ type region 38.

Additionally, due to the very high currents present during an ESD event, the current density across the N+/P− junction could exceed that necessary for damaging the junction. For that reason, the N+ regions are sized to provide a large junction area facing the P+ cathode electrode connection (the P− well is the actual cathode).

Figure 3:
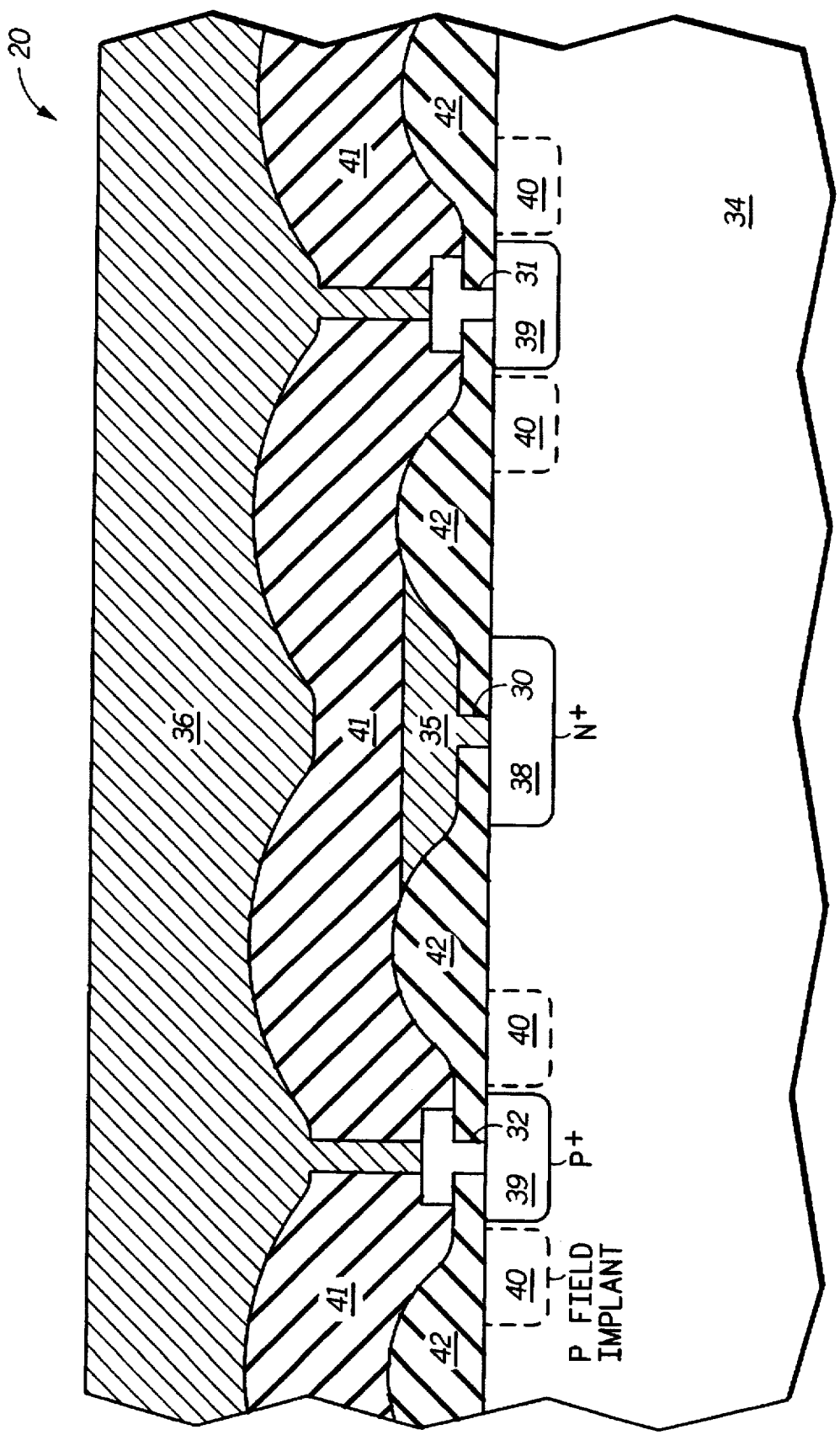
FIG. 3 illustrates a sectional view of a semiconductor diode configured in accordance with the present invention.

Referring next to FIG. 3, there is shown a cross section of a portion of diode 20. Diode 20 is manufactured within the P− substrate 34, or P well. In the present discussion, a plus sign ("+") after the letter P designates that there is a relatively heavier doping of a P type material into the P well. The minus sign ("−") after the letter P designating that there is relatively less doping within the P well of a P type material. In the designation for the P field implant 40 (shown by the dashed lines), there is no plus sign or minus sign designation indicating that the doping concentration within these regions is relatively lighter than that within the P+ type region 39, but relatively heavier than within the P− substrate 34, or P well. Thus, the minus and plus signs are provided herein and within FIGS. 3 and 4 for designating relative doping levels of the particular P type material and N type material.

Within the P− substrate 34, there is implanted the N+ type region 38 for the anode of diode 20. Also implanted is the P+ type region 39 for the cathode electrode connection of diode 20. The second metal layer 36 is provided access to the cathode by contacts 31 and 32 while the first metal layer 35 is provided access to the anode of diode 20 by contact 30. Contacts 30–32 are also shown in FIG. 4. Within FIG. 4, other similar "square" symbols represent other similar contacts. The second metal layer 36 (VSS) makes connection to the first metal layer 35 through the vias for the cathode electrode. The layers between the first metal layers 35 and the second metal layers 36 are composed of an insulating material, such as for example, an oxide.

The high-voltage characteristics of diode 20 are created by separating the N+ type implant region 38 from the P field implant 40. The P field implant 40 is produced to form a channel block so that an N channel cannot form between adjacent N+ regions. Normally, in a low-voltage application, the P field implant 40 will border both the P+ type diffused area and the N+ type diffused area. Diode 20 is provided with a higher breakdown voltage (relative to that obtained in a normal low-voltage application) by separating the P field from the N+ diffusion region. Note, that the region between the N+ diffused portion and the P field implant 40 may be comprised of merely the P− substrate 34 or a relatively lower concentration of a P field implant. In a normal low-voltage application where the P field "touches" the N+ type region, a junction is created with a steep gradient for the impurity concentration transition from N+ to P. The steeper the gradient, the narrower the depletion layer, and thus the lower the breakdown voltage. If the P field implant 40 is pulled back so that it does not "touch" the N+ diffusion region, then the junction is an N+/P− junction, which has a wider depletion layer and a higher breakdown voltage.

Diode 20, as illustrated in FIGS. 3 and 4, may be manufactured using well-known integrated circuit fabrication techniques.

Although the present invention and its advantages have been described in detail, it should be understood that various changes, substitutions and alterations can be made herein without departing from the spirit and scope of the invention as defined by the appended claims.

What is claimed is:

1. A circuit operable for protecting a protected device in an integrated circuit from energy having a voltage greater than a breakdown voltage of said protected device, said circuit comprising a semiconductor diode, wherein P and N portions of said diode are formed in a substrate and are separated by a portion of said substrate and a more highly doped portion of said substrate, a first terminal of said semiconductor diode coupled to an input pin of said integrated circuit and a second terminal of said semiconductor diode coupled to ground, wherein said semiconductor diode is coupled to said protected device, and wherein said semiconductor diode and said protected device have a substantially similar breakdown voltage.

2. The circuit as recited in claim 1, further comprising a steering device coupled between said semiconductor diode and said protected device operable for steering current associated with said energy to said semiconductor diode and away from said protected device.

3. The circuit as recited in claim 1, wherein said breakdown characteristics refer to breakdown voltages of said semiconductor diode and said protected device.

4. The circuit as recited in claim 3, wherein said semiconductor diode is an energy-absorbing device, and wherein said breakdown voltages are substantially equal.

5. The circuit as recited in claim 4, further comprising a steering device coupled between said semiconductor diode and said protected device operable for steering current associated with said energy to said semiconductor diode and away from said protected device.

6. The circuit as recited in claim 5, wherein said steering device is a resister, and wherein said energy is an electrostatic discharge.

7. The circuit as recited in claim 1, wherein said protected device is operable to provide a voltage received at said input pin to an EEPROM array.

8. The circuit as recited in claim 1, wherein said substrate is a P well, and wherein said more highly doped portion of said substrate is formed by a P field implant, wherein said more highly doped portion and said N portion are separated by said portion of said substrate.

9. The circuit as recited in claim 7, wherein said portion of said substrate is doped more lightly than said more highly doped portion.

10. A semiconductor diode comprising:
  a P well;
  an N type region formed in said P well for forming a first terminal of said semiconductor diode;
  a P type region formed in said P well for forming a second terminal of said semiconductor diode; and
  a more highly doped portion of said P well residing between said N type region and said P type region, wherein said more highly doped portion is separated from said N type region by a portion of said P well.

11. The diode as recited in claim 10, wherein said more highly doped portion comprises a P field implant.

12. The diode as recited in claim 10, wherein said diode is implemented as a protection device coupled to an input pad of an integrated circuit, wherein said diode is operable for protecting internal circuitry of said integrated circuit from a voltage surge.

13. The diode as recited in claim 12, wherein said diode is operable for handling voltages above 5.5 volts.

14. An integrated circuit comprising:
  circuitry requiring a voltage provided externally to said integrated circuit; and
  a protection circuit for protecting said circuitry from an electrostatic discharge voltage, said protection circuit comprising a diode coupled to an input pin of said integrated circuit, wherein said diode having P and N portions formed in a substrate and separated by a portion of said substrate and a more highly doped portion of said substrate, a first terminal of said diode coupled to said input pin of said integrated circuit and a second terminal of said diode coupled to ground, and wherein said diode and said circuitry have substantially similar breakdown voltages.

15. The circuit as recited in claim 14, further comprising a steering device coupled between said diode and said circuitry operable for steering current associated with an electrostatic discharge voltage away from said circuitry and through said diode.

16. The circuit as recited in claim 14, wherein said substrate is a P well, and wherein said more highly doped portion of said substrate is formed by a P field implant, wherein said more highly doped portion and said N portion are separated by said portion of said substrate.

* * * * *